United States Patent
Koo et al.

(10) Patent No.: US 6,936,528 B2
(45) Date of Patent: Aug. 30, 2005

(54) METHOD OF FORMING COBALT SILICIDE FILM AND METHOD OF MANUFACTURING SEMICONDUCTOR DEVICE HAVING COBALT SILICIDE FILM

(75) Inventors: Kyeong-mo Koo, Yongin (KR); Ja-hum Ku, Seongnam (KR); Hye-jeong Park, Seoul (KR)

(73) Assignee: Samsung Electronics Co., Ltd., Suwon-Si (JP)

( * ) Notice: Subject to any disclaimer, the term of this patent is extended or adjusted under 35 U.S.C. 154(b) by 4 days.

(21) Appl. No.: 10/686,768

(22) Filed: Oct. 17, 2003

(65) Prior Publication Data

US 2004/0132268 A1 Jul. 8, 2004

Related U.S. Application Data

(63) Continuation-in-part of application No. 10/457,449, filed on Jun. 10, 2003, now abandoned.

(30) Foreign Application Priority Data

Oct. 17, 2002 (KR) ................................. 10-2002-0063567
Sep. 25, 2003 (KR) ................................. 10-2003-0066498

(51) Int. Cl.⁷ ............................................. H01L 21/44
(52) U.S. Cl. ...................... 438/583; 438/664; 438/683
(58) Field of Search ................................... 438/583, 664

(56) References Cited

U.S. PATENT DOCUMENTS

| 5,911,114 | A | 6/1999 | Naem |
|---|---|---|---|
| 6,171,959 | B1 * | 1/2001 | Nagabushnam ............. 438/683 |
| 6,329,276 | B1 * | 12/2001 | Ku et al. .................... 438/586 |
| 6,335,294 | B1 | 1/2002 | Agnello et al. |
| 6,391,767 | B1 | 5/2002 | Huster et al. |
| 6,451,693 | B1 | 9/2002 | Woo et al. |
| 6,551,927 | B1 * | 4/2003 | Chen et al. ................. 438/664 |
| 6,657,244 | B1 | 12/2003 | Dokumaci et al. |
| 2002/0022366 | A1 | 2/2002 | Cabral et al. |

* cited by examiner

Primary Examiner—Thao P. Le
(74) Attorney, Agent, or Firm—Volentine Francos & Whitt, P.L.L.C.

(57) ABSTRACT

A cobalt-containing film on a silicon-containing conductive region, and a titanium-rich capping layer is formed on cobalt-containing film. The atomic % ratio of titanium to other elements (if any) in the titanium-rich capping layer is more than one (1). The resultant structure is annealed so that cobalt of the cobalt-containing film and silicon of the silicon-containing conductive region react with each other to form a cobalt silicide film. When the formation of the cobalt-containing film is carried out at a high temperature, a diffusion restraint interface film is also formed.

49 Claims, 16 Drawing Sheets

METHOD OF FORMING COBALT SILICIDE FILM AND METHOD OF MANUFACTURING SEMICONDUCTOR DEVICE HAVING COBALT SILICIDE FILM

CROSS-REFERENCE TO RELATED APPLICATIONS

This is a continuation-in-part of U.S. patent application Ser. No. 10/457,449, filed Jun. 10, 2003 now abandoned, the entire contents of which are incorporated herein by reference. In addition, a claim of priority is made to Korean Patent Application Nos. 2002-63567 and 2003-66498, filed Oct. 17, 2002 and Sep. 25, 2003, respectively, the entire contents of which are incorporated herein by reference.

BACKGROUND OF THE INVENTION

1. Field of the Invention

The present invention generally relates to the fabrication of semiconductor devices, and more particularly, the present invention relates to a method of forming a cobalt silicide film and to a method of manufacturing a semiconductor device having a cobalt silicide film.

2. Description of the Related Art

As the gate resistance and source/drain contact resistance of a metal oxide semiconductor (MOS) increases, the operation speed of a semiconductor device containing the MOS transistor decreases. Accordingly, silicide films have been widely used to decrease these resistances. Cobalt silicide films, in particular monocobalt disilicide ($CoSi_2$) films, are especially useful in view of their low resistance (16 to 18 $\mu\Omega cm$), good thermal stability, and reduced sheet resistance (Rs) dependency to size. Cobalt silicide films have been used in static random access memory (SRAM) devices and in logic devices that require high operation speeds.

A cobalt silicide film having poor characteristics can result if impurities such as silicon oxide and silicon nitride are present at a surface of a silicon region on which the cobalt silicide film is formed. For this reason, prior to deposition of the cobalt silicide film, a substrate surface is conventionally wet-cleaned and then etched by radio frequency (RF) sputtering. Unfortunately, however, substrate surface defects can result since RF sputter etching is a physical etching process using argon ions ($Ar^+$). In addition, resputtering occurs during the RF sputter etching which can result in a poorly formed cobalt silicide film in which short-circuits can occur between active regions.

FIG. 1 is a plan view of a semiconductor device in which a cobalt silicide film has created a short-circuit between active regions. In FIG. 1, reference numeral 3 denotes an active region, reference numeral 4 a well region boundary, reference numeral 5 denotes a gate, reference numeral 7 denotes a gate spacer, and reference numeral 11c indicates a cobalt silicide film. As shown, the colbalt silicide film 11c is defective in that it connects adjacent active regions 3 across the well region boundary 4.

FIG. 2 is a diagram for explaining the occurrence of resputtering during RF sputter etching, and FIG. 3 is a diagram showing the poorly formed cobalt silicide film resulting from the resputtering. FIGS. 2 and 3 are sectional views taken along line II–II' in FIG. 1.

As shown in FIG. 2, during the RF sputter etching 10, the oxide 2a of a shallow trench device isolation region (STI) 2 and/or the nitride 7a of the spacer 7 is resputtered onto the active region 3 or the gate 5 of the semiconductor device. Also, the silicon 3a of the active region 3 is resputtered on the spacer 7.

As shown in FIG. 3, the resputtered oxide 2a and nitride 7a cause the cobalt silicide film 11a formed on the active region 3 and a cobalt silicide film 11b formed on the gate 5 to have a nonuniform thickness. Also, the resputtered silicon 3a causes a cobalt silicide film 11c to be formed along the surfaces of the sidewalls of the spacer 7. The result can be the short-circuiting of active regions as shown in FIG. 1.

Meanwhile, referring to FIG. 4, transformation of a cobalt film 11 formed on the front surface of a substrate into a cobalt silicide film mainly takes place at the edges of a gate 5a pattern and the edges at which the STI 2 and active region 3 are in contact with each other. This phenomenon is called an "edge effect" and is denoted by reference number 13 in FIG. 4. The edge effect causes the thickness of the cobalt silicide film 11d to increase, which in turn causes loading of the Rs of the silicide film, making it difficult to adjust the Rs value. Furthermore, the edge effect can cause leakage current at the source/drain region 8. These drawbacks are intensified as the critical dimension (CD) of the gate is reduced to less than 100 nm. As shown in FIG. 4, the thickness of a cobalt silicide film lie formed at the gate 5b having a small CD is almost twice as large as that of the cobalt silicide film 11d formed at the gate 5a having a larger CD. This creates a limitation in decreasing the aspect ratio of the gate 5b pattern, which adversely affects the process margin for subsequent processes.

SUMMARY OF THE INVENTION

The present invention provides a method of forming a cobalt silicide film having favorable characteristics.

The present invention also provides a method of forming a cobalt silicide film with a large process window which facilitates adjustment of a sheet resistance by adjustment of process variables.

The present invention also provides a method of manufacturing a semiconductor device using the method of forming a cobalt silicide film.

According to an aspect of the present invention, there is provided a method of forming a cobalt silicide film, the method comprising: forming a cobalt-containing film on a surface of a semiconductor substrate having an insulating region and a silicon-containing conductive region; forming a titanium-rich capping film on the cobalt-containing film to obtain a resultant structure, the titanium-rich capping film having a titanium/other elements atomic % ratio of more than 1; and annealing the resultant structure so that cobalt of the cobalt-containing film and silicon of the silicon-containing conductive region react with each other to form the cobalt silicide film.

According to another aspect of the present invention, there is provided a method of forming a cobalt silicide film, the method comprising: forming a cobalt-containing film on a surface of a semiconductor substrate having an insulating region and a silicon-containing conductive region, the cobalt-containing film being formed at a temperature at which cobalt of the cobalt-containing film and silicon of the silicon-containing conductive region react with each other to form a diffusion restraint interface film made of dicobalt monosilicide or monocobalt monosilicide; forming a titanium-rich capping film on the cobalt-containing film to obtain a resultant structure, the titanium-rich capping film having a titanium/other elements atomic % ratio of more than 1; and annealing the resultant structure so that the diffusion restraint interface film is transformed into a monocobalt disilicide film, and cobalt of the cobalt-containing film reacts with silicon of the silicon-containing conductive region to form a monocobalt disilicide film.

According to yet another aspect of the present invention, there is provided a method of manufacturing a semiconductor device using the methods of forming a cobalt silicide film according to the invention. In this case, the silicon-containing conductive region may be a source/drain region or a poly-silicon gate formed in/on an active region of a semiconductor substrate.

BRIEF DESCRIPTION OF THE DRAWINGS

The above and other features and advantages of the present invention will become readily apparent from the detailed description that follows, with reference to the accompanying drawings, in which.

Figure 8A:
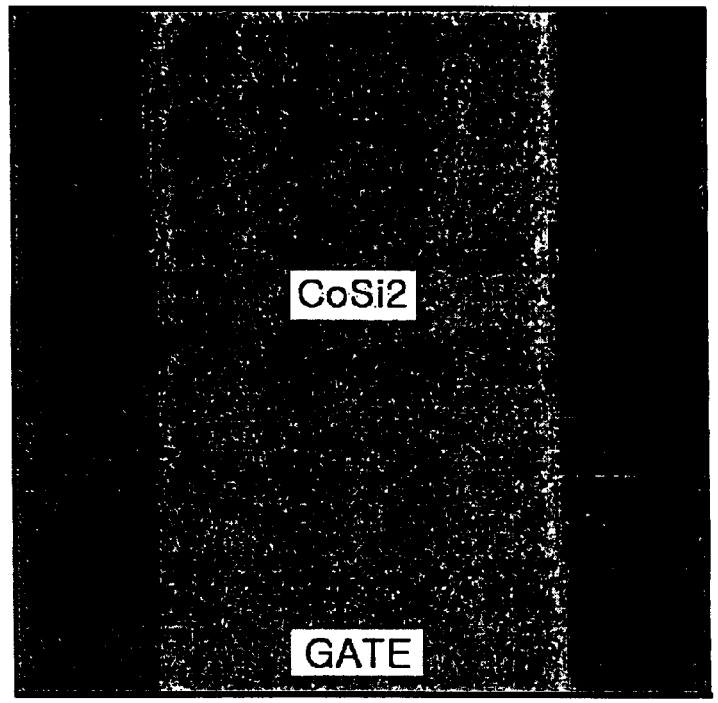
Figure 8B:
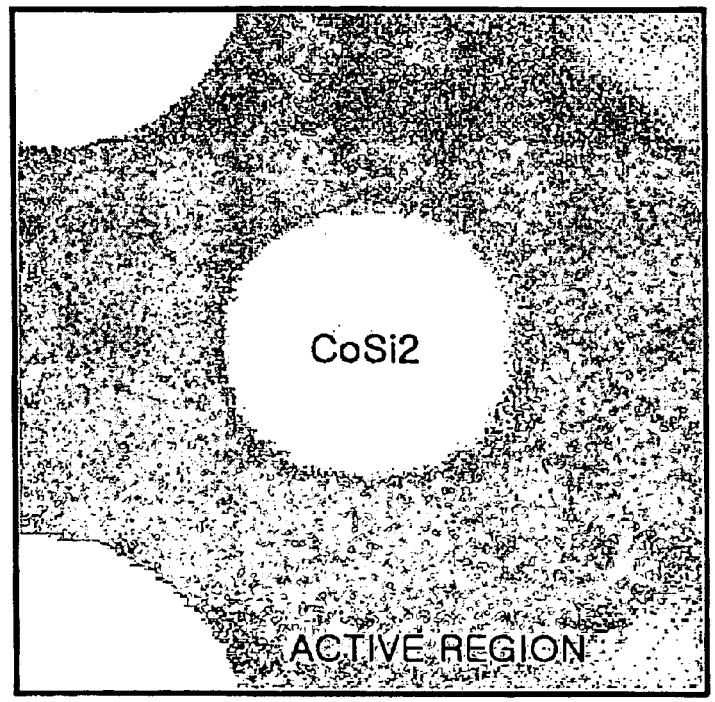
Figure 9A:
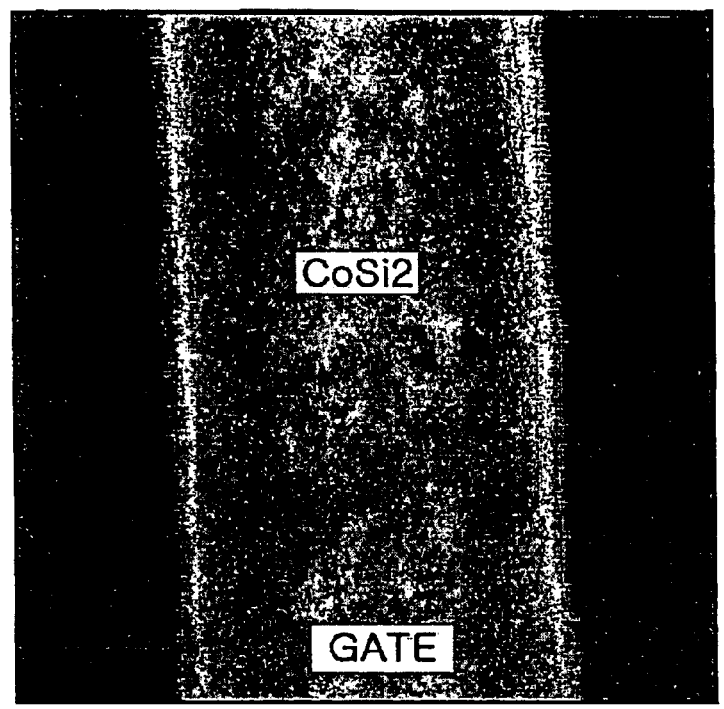
Figure 9B:
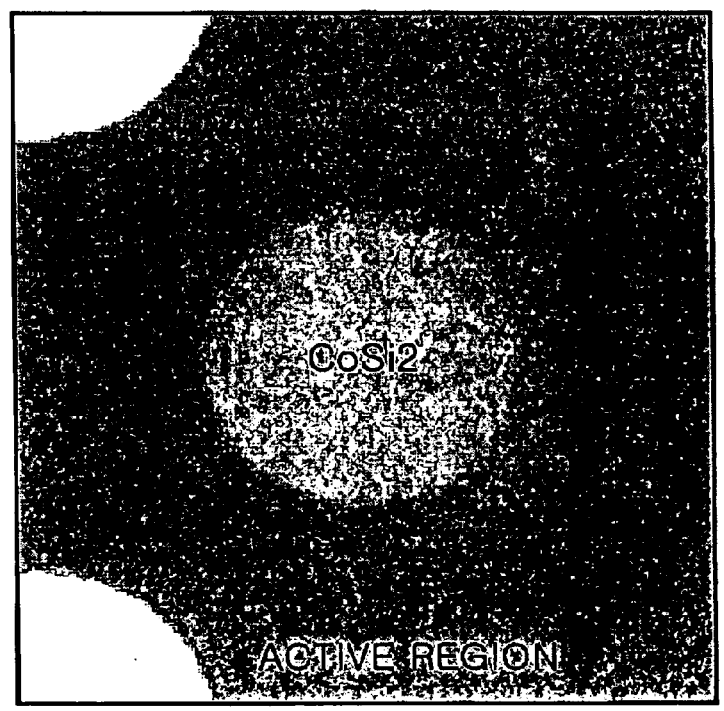
Figure 10A:
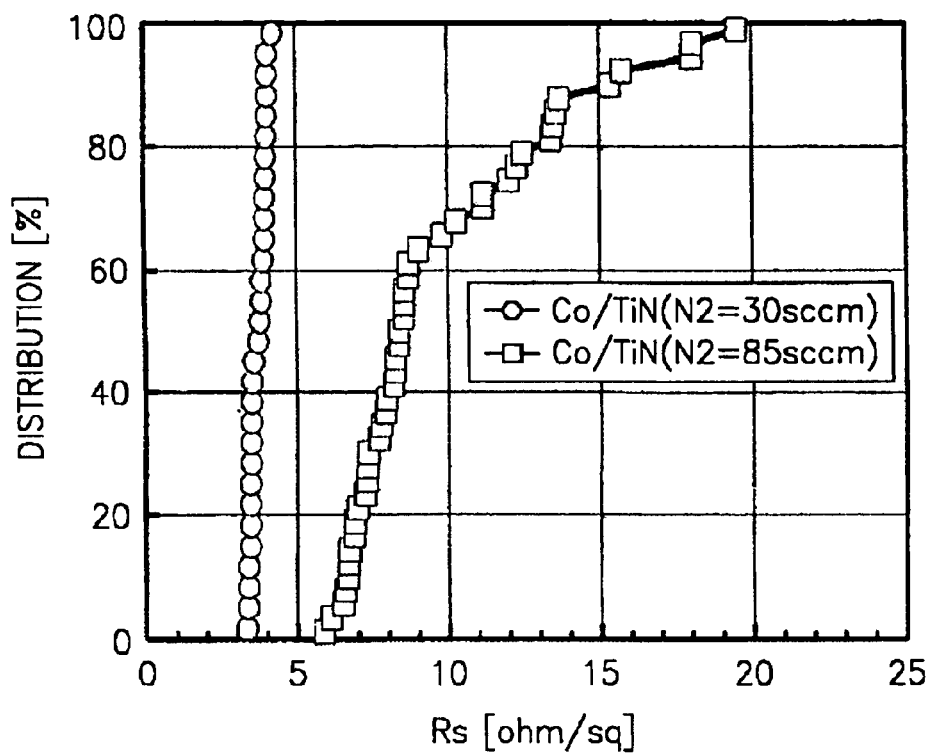
Figure 10B:
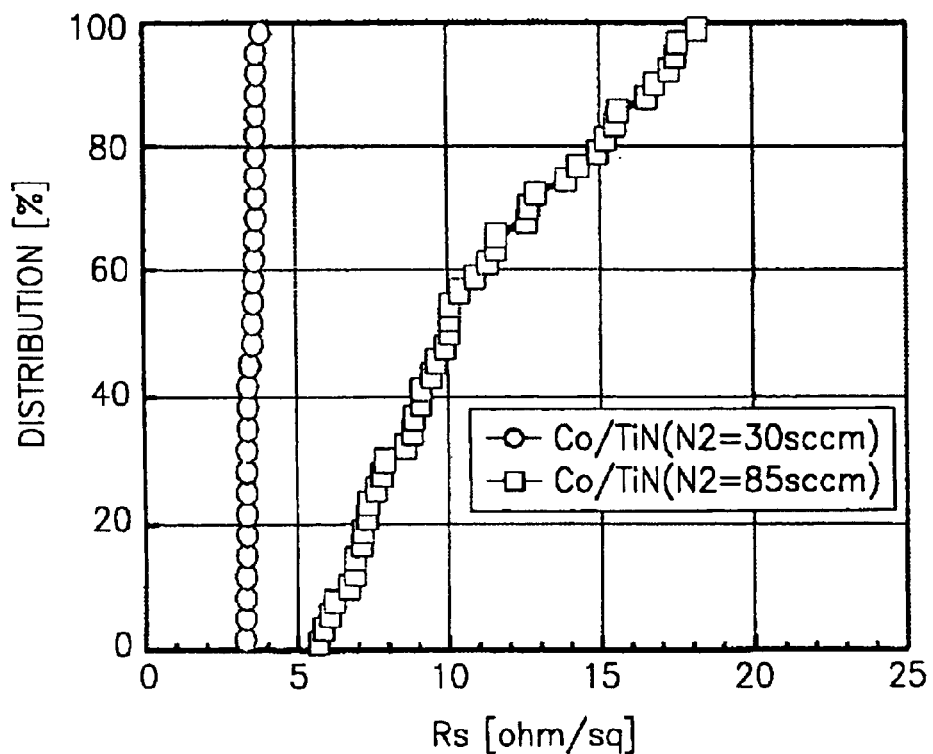
Figure 11A:
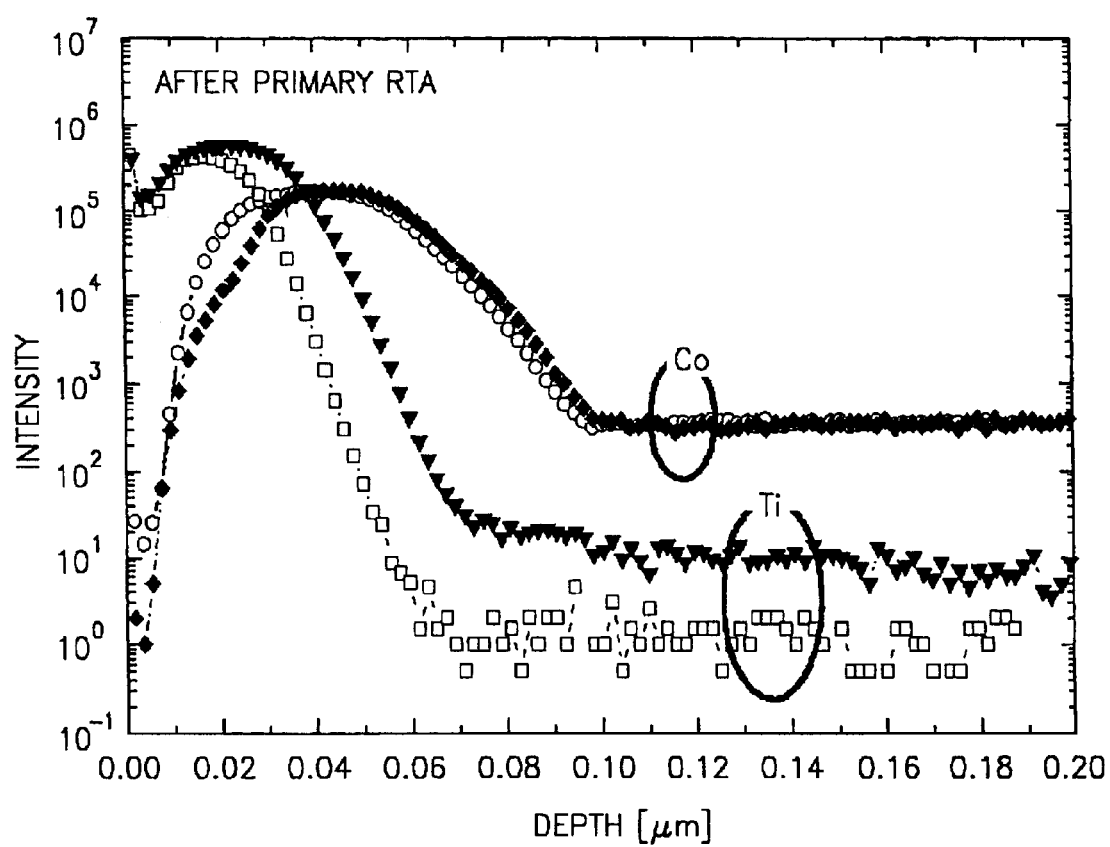
Figure 11B:
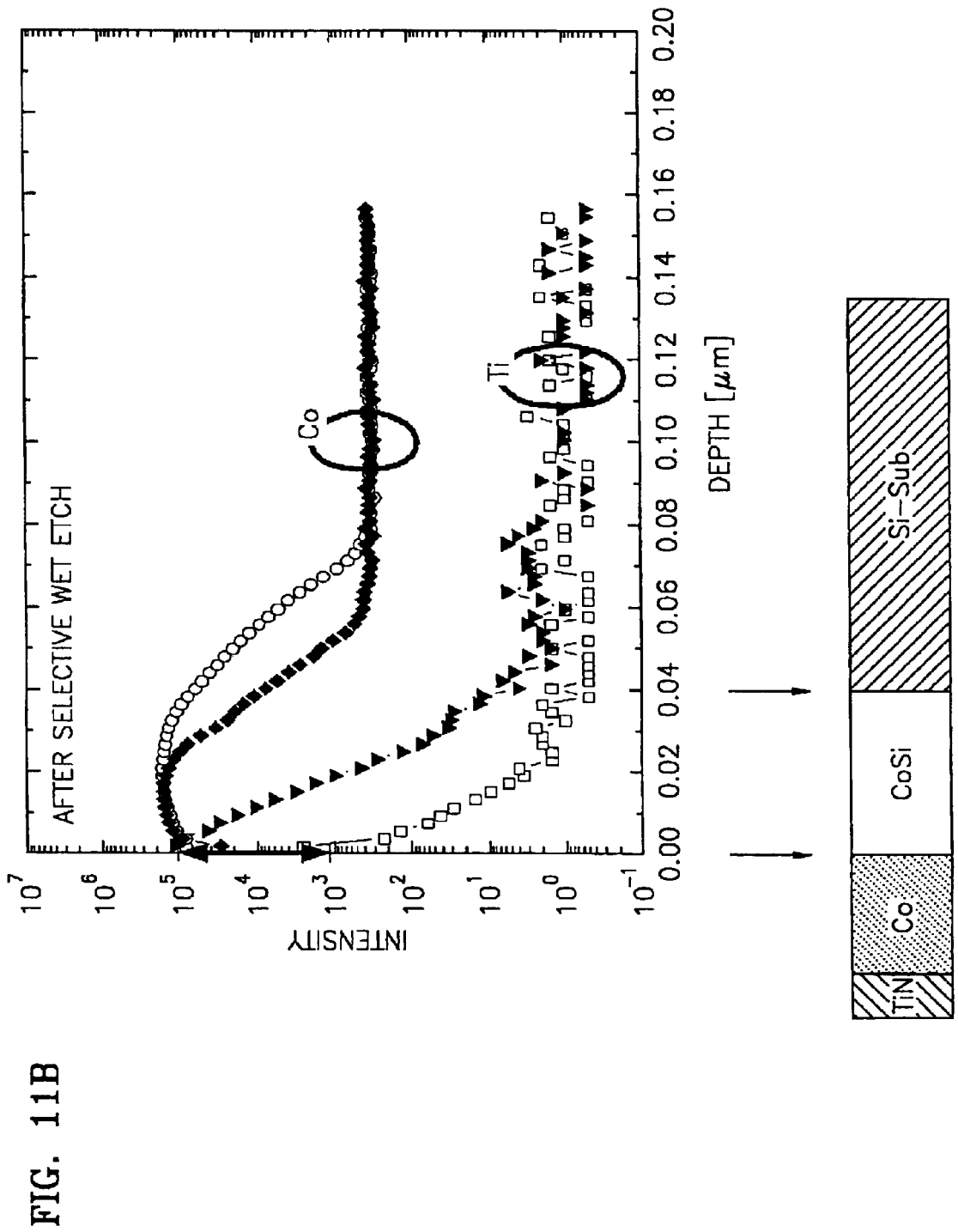
Figure 12:
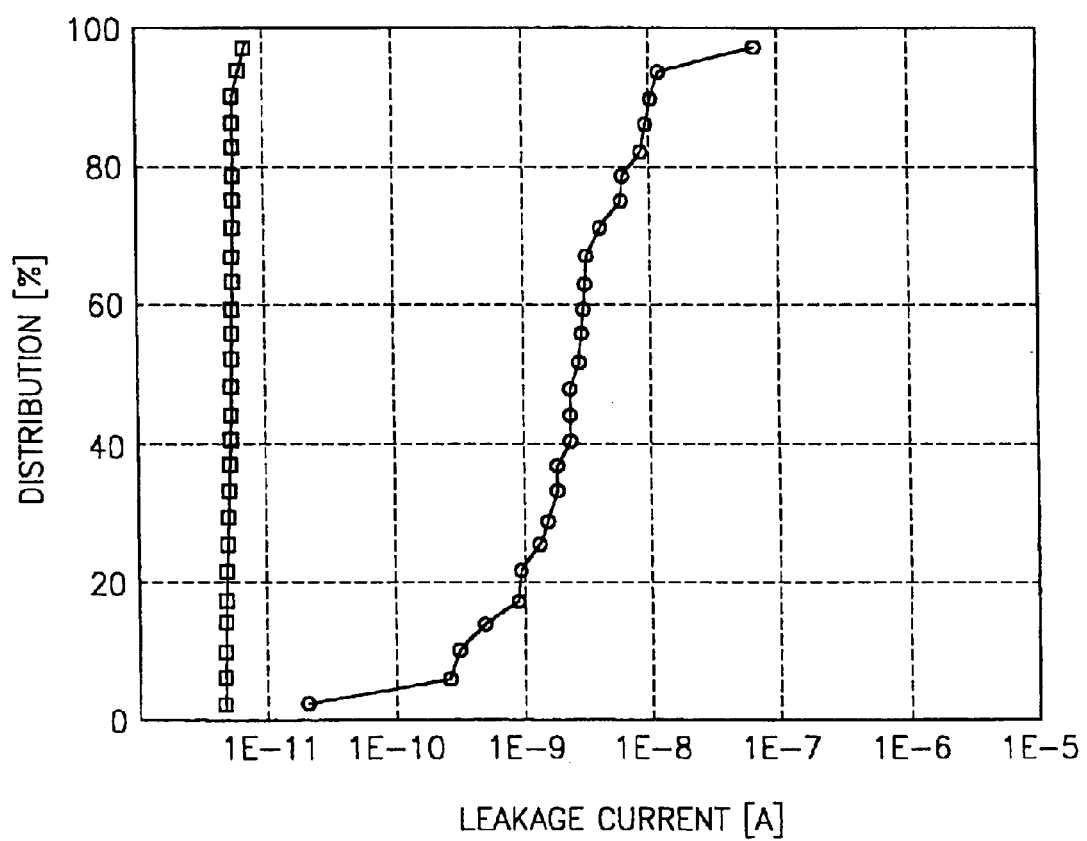
Figure 13A:
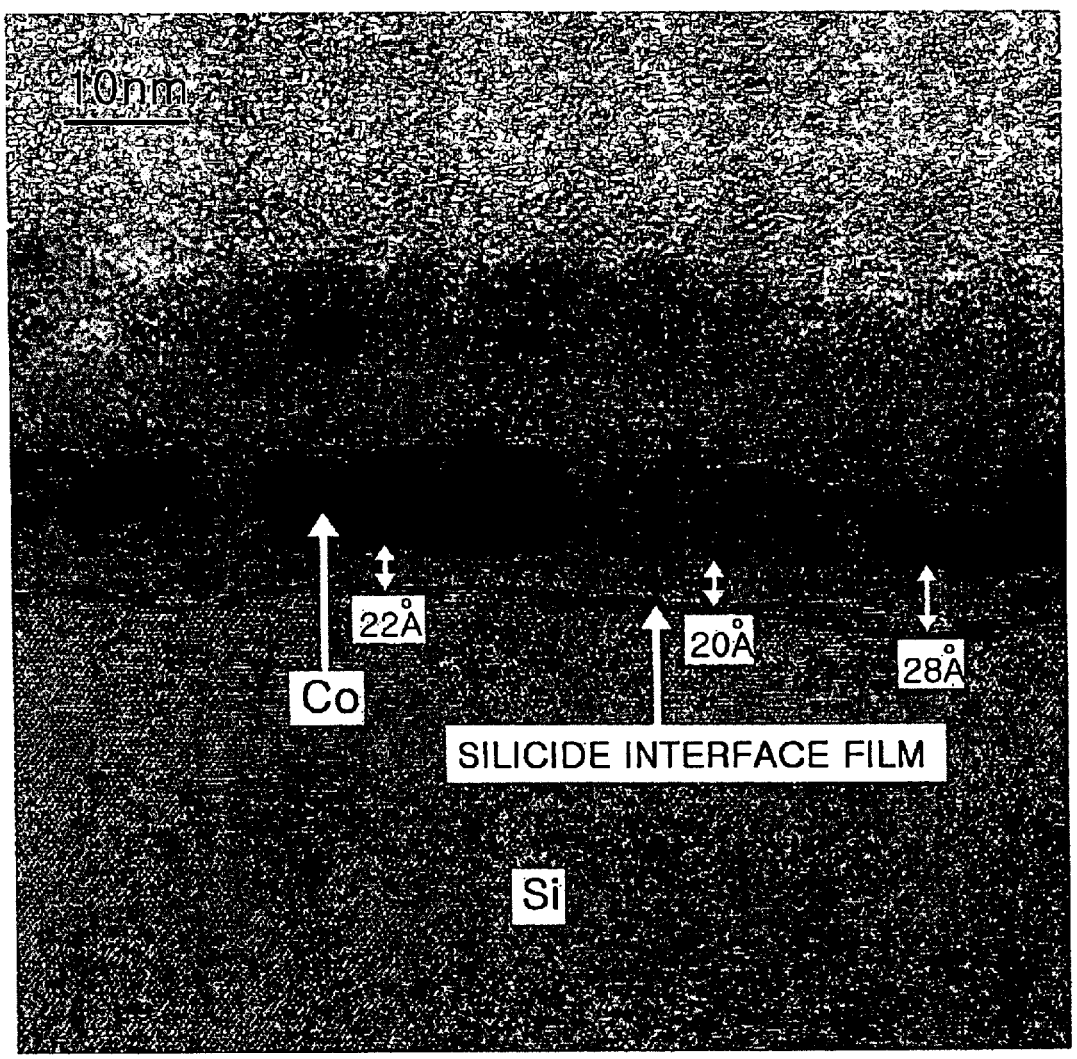
Figure 13B:
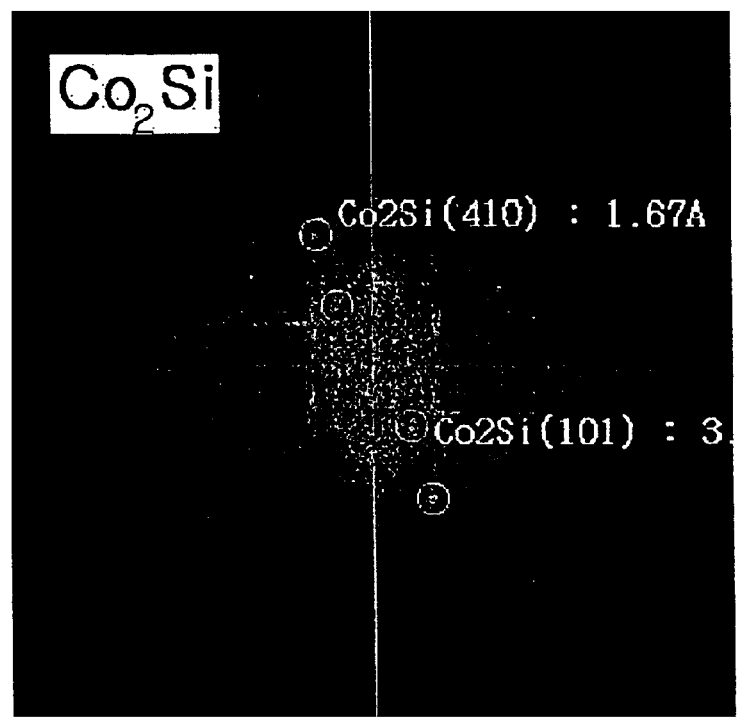
Figure 13C:
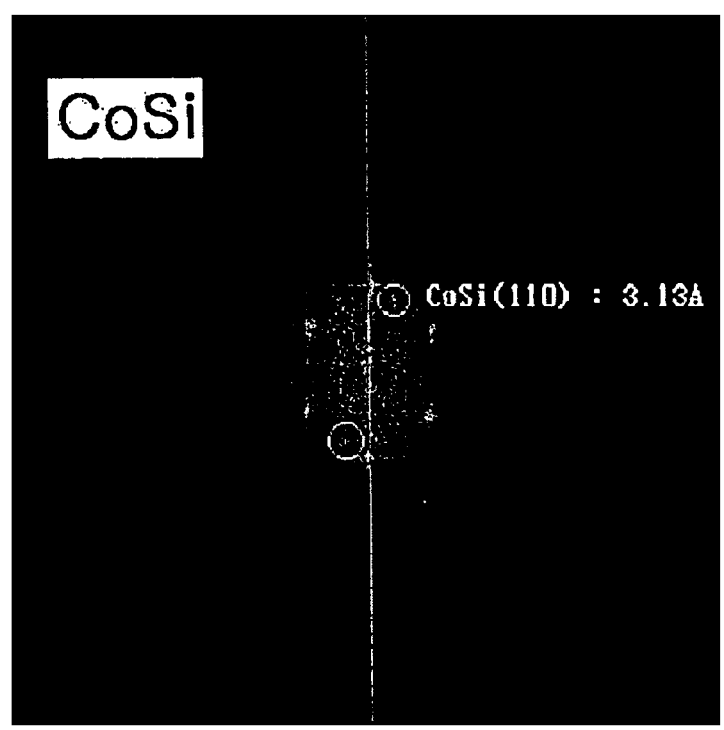
Figure 14:
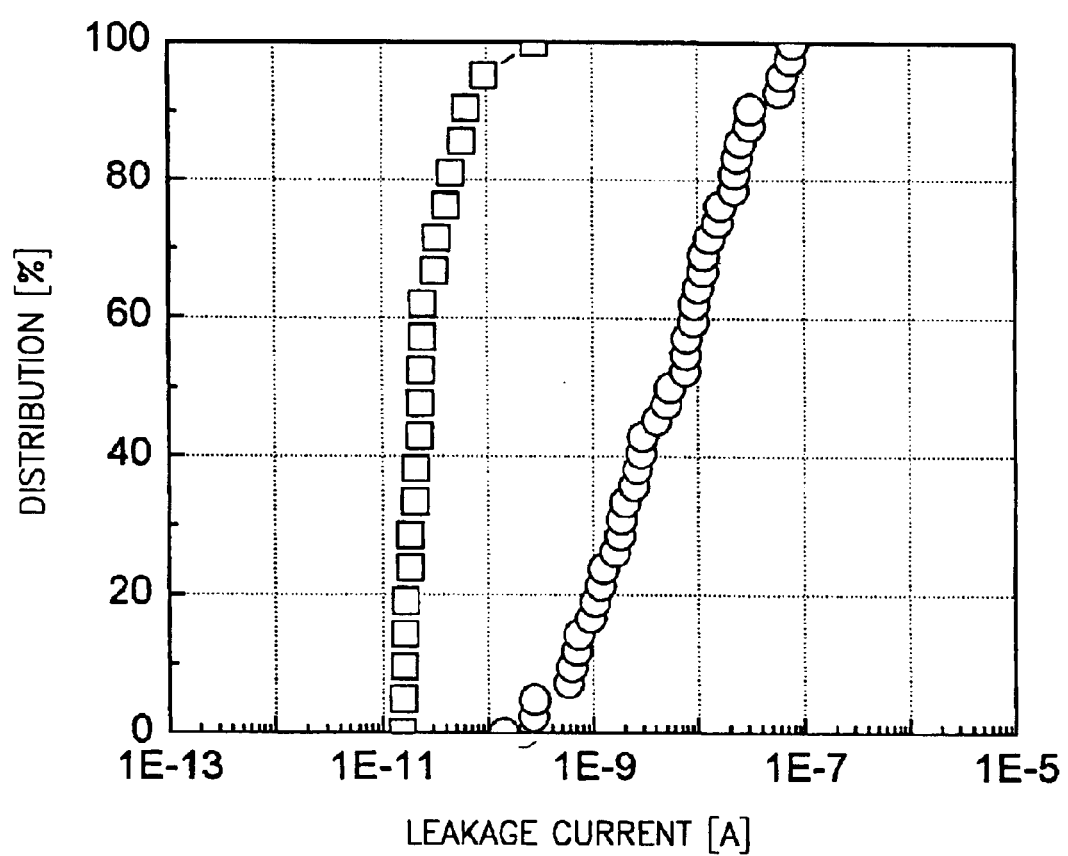

FIGS; 8A and 8B are scanning electron microphotographs (SEMs) of cobalt silicide films according to an embodiment of the present invention;

FIGS. 9A and 9B are SEMs of control sample cobalt silicide films for comparison with the films of FIGS. 8A and 8B;

FIGS. 10A and 10B are graphs showing Rs values of gates having cobalt silicide films according to an embodiment of the present invention and according to a conventional method;

FIG. 11A is a graph showing secondary ion-mass spectrometric (SIMS) results after primary rapid thermal annealing (RTA) according to an embodiment of the present invention and according to a conventional method;

FIG. 11B is a graph showing SIMS results after a selective wet etching according to an embodiment of the present invention and according to a conventional method;

FIG. 12 is a graph showing a leakage current of a test sample which has been pretreated by a wet-clean process only according to the present invention, and a leakage current of a control sample which has been pretreated by a wet-clean process and then etched by radio frequency (RF) sputtering according to a conventional method;

FIG. 13A is a transmission electron microphotograph (TEM) of a sample formed after depositing a cobalt film at a high temperature according to an embodiment of the present invention;

FIGS. 13B and 13C show selected area diffraction (SAD) patterns of an interface film formed by the high temperature deposition in FIG. 13A; and FIG. 14 is a graph showing leakage current characteristics in the case of depositing a cobalt film at a high temperature according to an embodiment of the present invention and in the case of depositing a cobalt film according to a conventional method.

DETAILED DESCRIPTION OF THE PREFERRED EMBODIMENTS

Embodiments of the present invention are at least partially characterized by the deposition of a titanium (Ti) rich film on a previously formed cobalt (Co) containing film. Ti, which is abundantly present in the capping film, diffuses toward an interface between the Co film and an underlying silicon containing layer, such as a bulk Si film or a (poly)Si film, to remove oxides and nitrides at the interface. The removal of oxides and nitrides results in a high quality cobalt suicide film. Further, some embodiments of the present invention are further characterized the use of a wet pretreatment process that sufficiently removes a natural oxide film formed at a surface intended for formation of the cobalt silicide film. Pretreatment by radio frequency (RF) sputter etching is not required, and therefore resputtering of oxide, nitride, and/or Si is avoided. In this regard, as used herein, the phrase "wet cleaning is used/carried out alone" means that a RF sputter etching is omitted in the pretreatment process. Still further, several embodiments of the present invention are characterized by the formation of a Co film at a high temperature to compensate for the small process window for formation of a cobalt silicide film resulting from the edge effect.

Hereinafter, by way of example, a method of forming a cobalt silicide film on a gate and an active region in a full CMOS (complementary metal oxide semiconductor)-type SRAM (static random access memory) device will be described.

Figure 1:
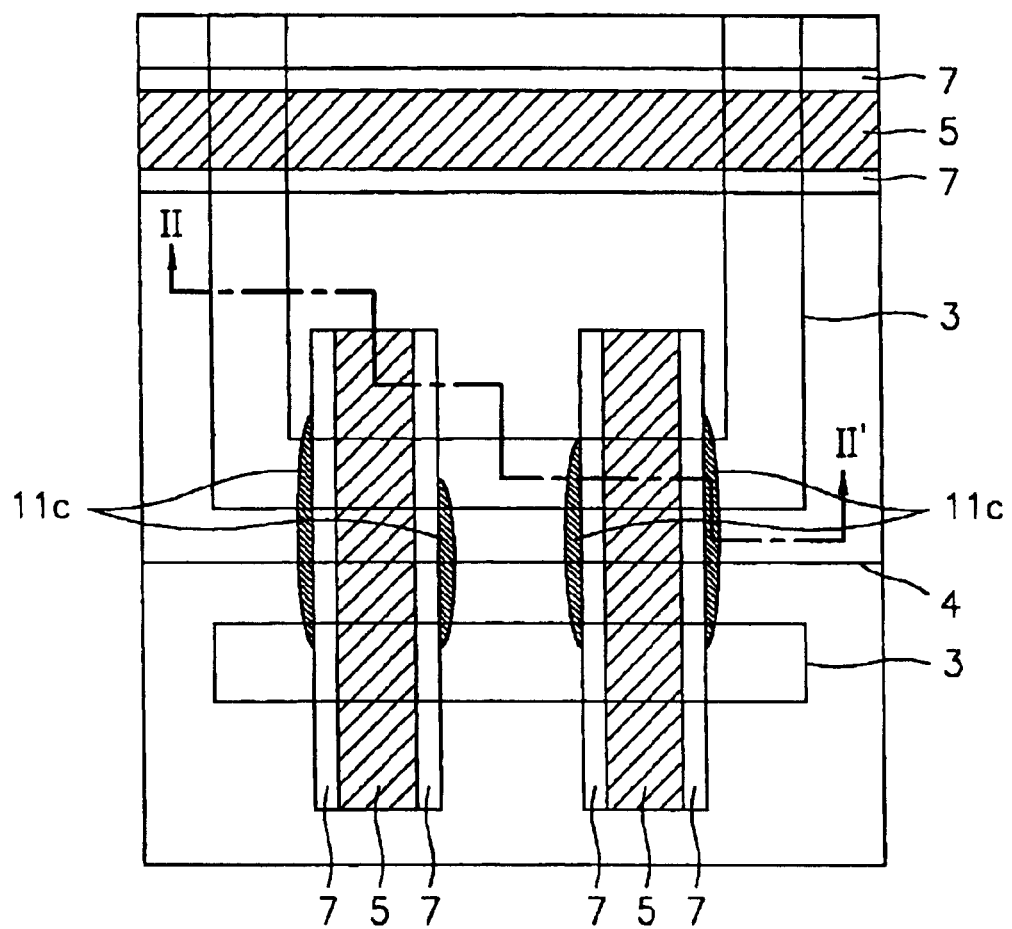
FIG. 1 is a plan view showing a short-circuit between active regions resulting from a conventional method of forming a cobalt silicide film.
Figure 2:
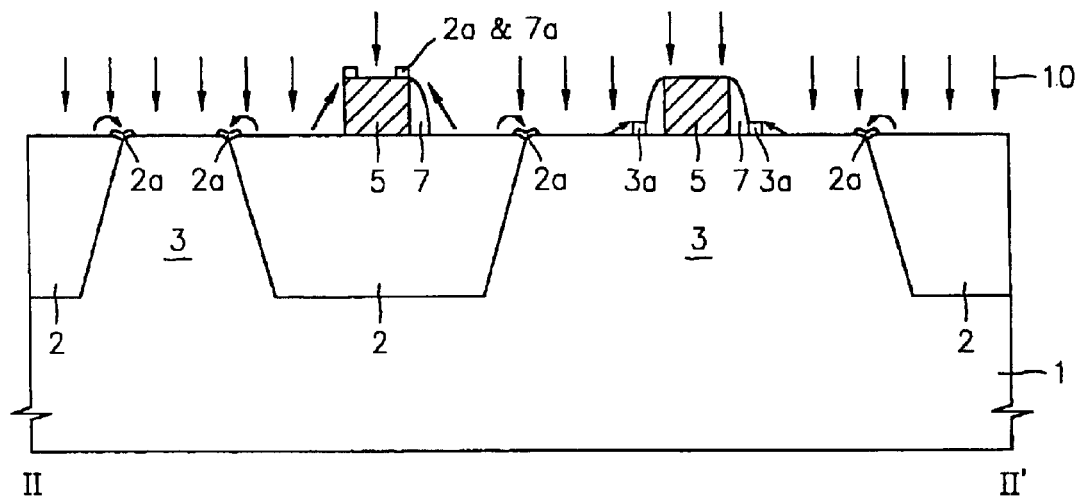
FIG. 2 is a sectional view for explaining the resputtering that occurs during the conventional method of forming a cobalt silicide.
Figure 3:
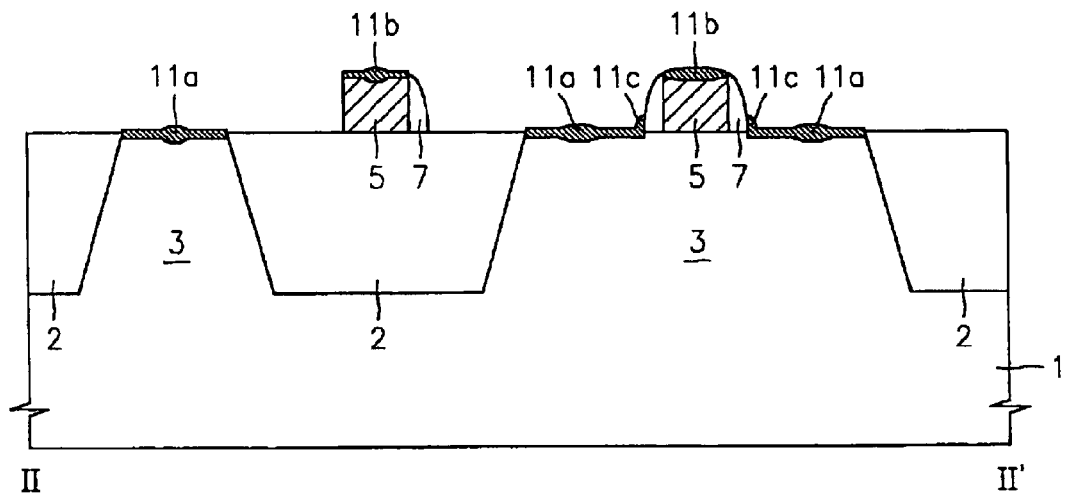
FIG. 3 is a sectional view of a poor cobalt silicide film formed by resputtering.
Figure 4:
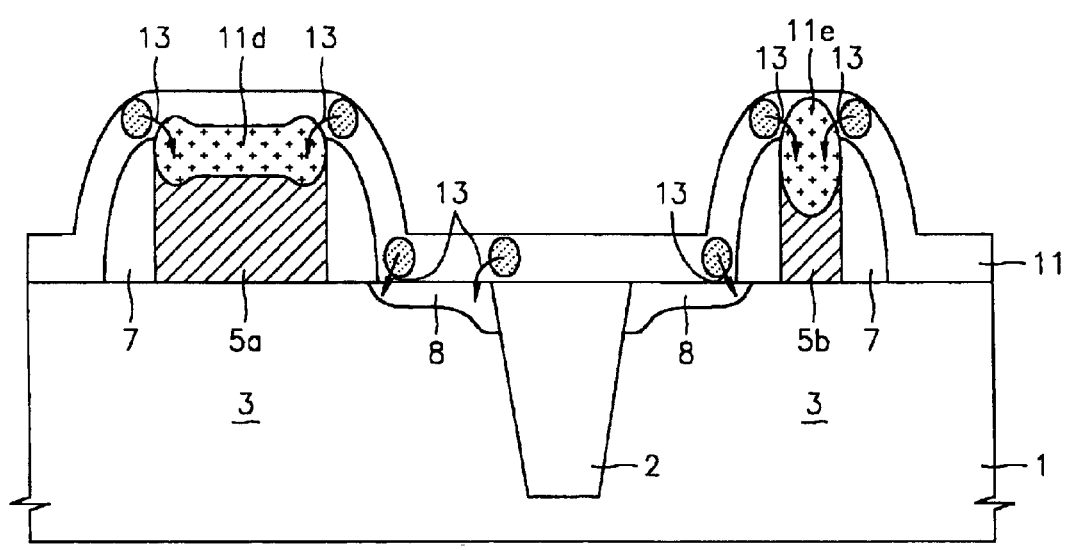
FIG. 4 is a sectional view for explaining an edge effect resulting from the conventional method of forming a cobalt silicide film, and a loading of the sheet resistance (Rs) of the silicide film caused by the edge effect.
Figure 5:
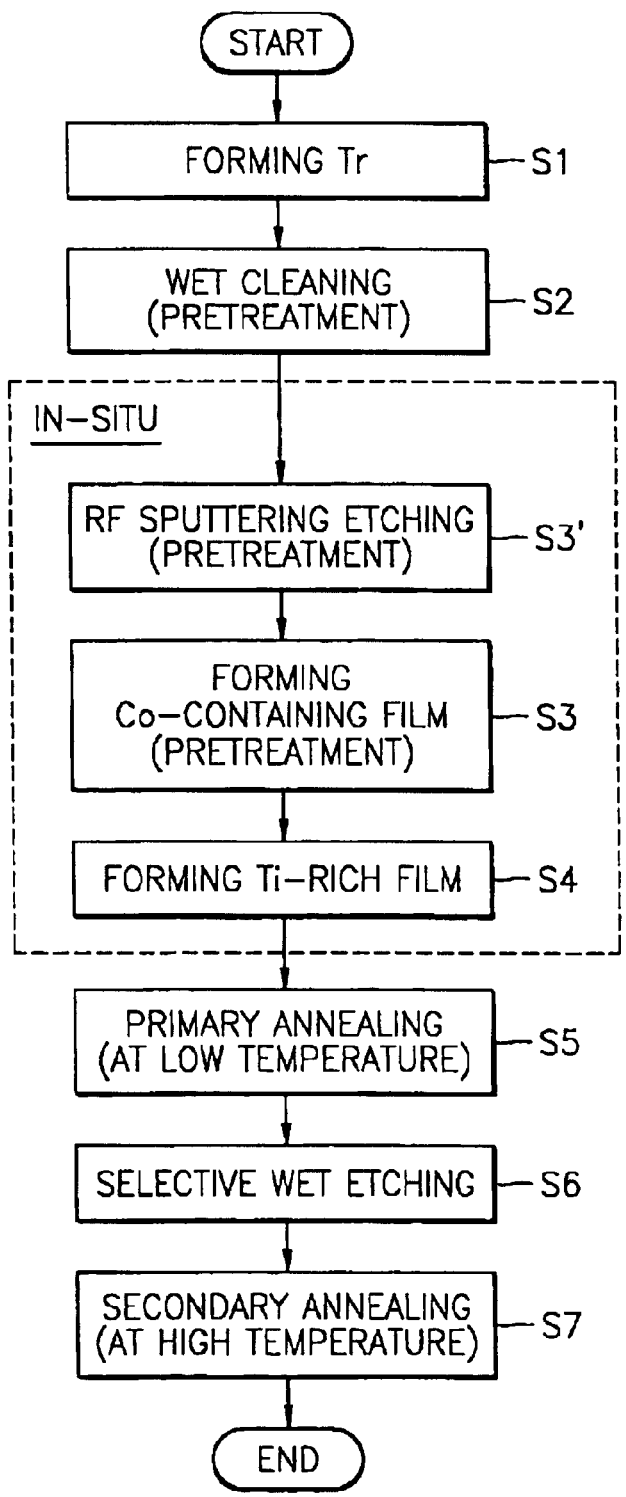
FIG. 5 is a flow chart of a method of forming a cobalt silicide film according to one embodiment of the present invention.

FIG. 5 is a flow chart of a method of forming a cobalt silicide film according to an embodiment of the present invention. FIGS. 6A through 6D are sectional views of intermediate products resulting from the process steps of FIG. 5.

Figure 6A:
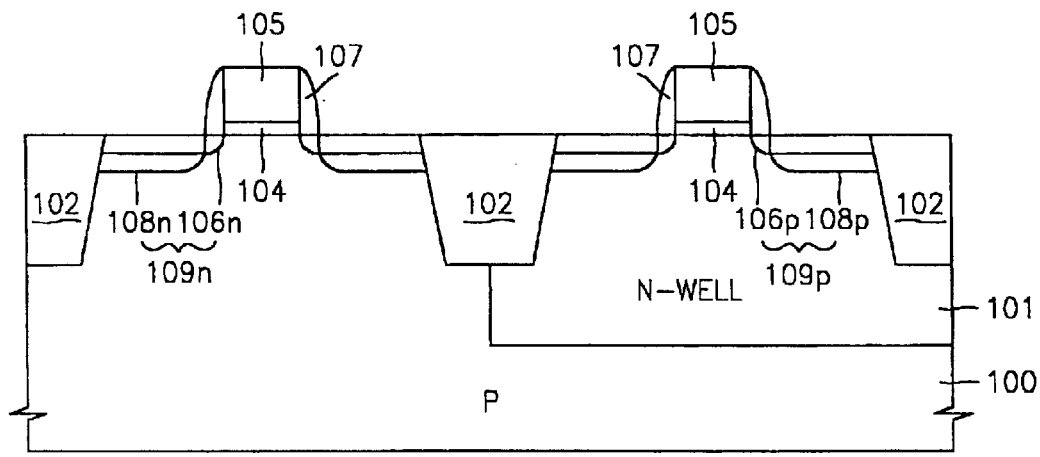
FIGS. 6A through 6D are sectional views of intermediate structures formed in steps of the method of FIG. 5.

Referring to FIGS. 5 and 6A, first, a transistor (Tr) is formed (step S1). In detail, after forming a shallow trench isolation (STI) region 102 using a conventional process, an N-well 101 and a P-well (not shown) are formed on a p-type Si substrate 100 using an ion injection. Then, on the substrate 100, an oxide film is formed to a thickness of 110 to 130 Å and a poly-Si film is formed to a thickness of 1,500 to 2,500 Å, followed by successive patterning, to form a gate 105 and a gate oxide film 104. The gate oxide film 104 may be formed by depositing an oxide such as silicon oxide, hafnium oxide, zirconium oxide, aluminum oxide, tantalum oxide, and lanthanum oxide using a chemical vapor deposition (CVD) or an atomic layer deposition (ALD). The gate 105 made of poly-Si may be formed by depositing poly-Si doped with impurity using low pressure CVD (LPCVD). Poly-Si may be deposited simultaneously with impurity doping or may be doped with impurity after deposition. Then, an ion injection is carried out for formation of a lightly doped drain (LDD) region. A LDD 106n for an NMOS transistor is formed by injection of an n-type ion such as As$^+$, and a LDD 106p for a PMOS transistor is formed by injection of a p-type ion such as BF$_2^+$. Then, a spacer 107 is formed at a sidewall of the gate 105. The spacer 107 may be a silicon nitride film or may be a laminated structure of a middle temperature oxide (MTO) film and a silicon nitride film. After the formation of the spacer 107, an n+ source/drain region 108n is formed by injection of an n-type ion such as As$^+$, and a p+ source/drain region 108p is formed by injection of a p-type ion such as $BF_2^+$. Finally, an NMOS source/drain (109n) and a PMOS source/drain (109p) are formed.

Figure 6B:
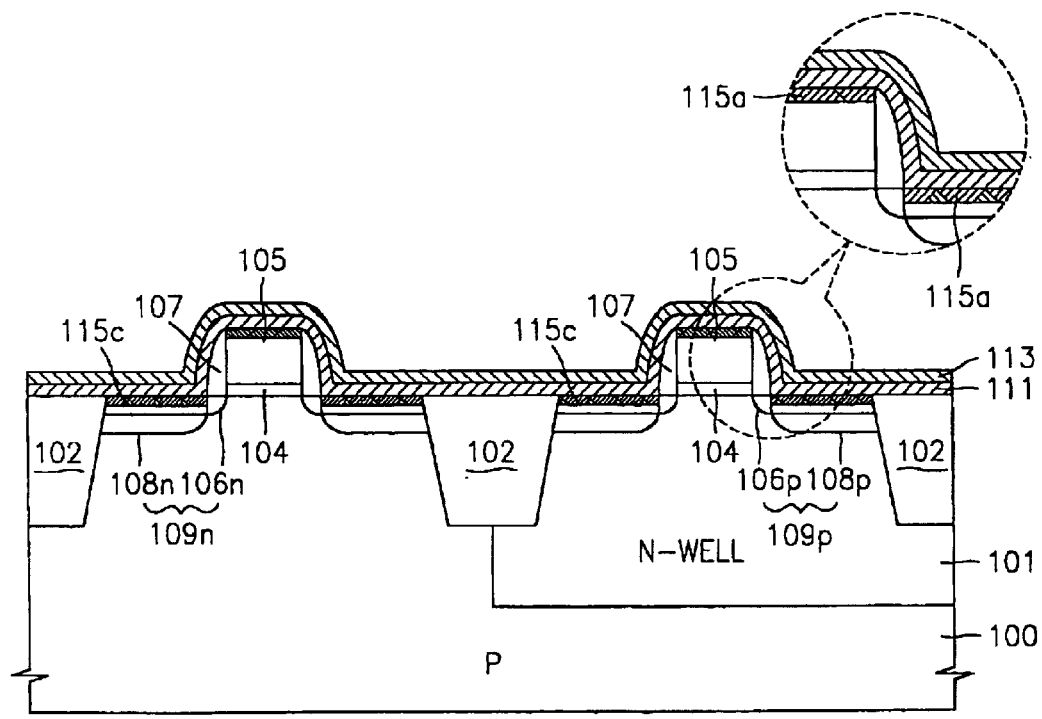

Referring to FIGS. 5 and 6B, a pretreatment process is carried out (steps S2 and S3'). After the pretreatment process, a Co-containing film 111 is formed (step S3) and a Ti-rich capping film 113 is formed (step S4). In the pretreatment process (steps S2 and S3'), impurities, for example, natural oxide films formed on the source/drain regions 109n and 109p and the gate 105, and/or nitride particles remaining from formation of the spacer 107 are removed. For the pretreatment process, a wet cleaning (step S2) may be used alone or in combination with RF sputter etching (step S3').

Impurities such as oxide and nitride may also be generated due to resputtering caused after the RF sputter etching. However, as will be described later, these impurities are removed by Ti which is abundantly present in the capping film 113 formed in a subsequent process.

The RF sputter etching can be selectively carried out when needed. Various modifications in the wet cleaning may be made according to whether or not the subsequent RF sputter etching is carried out. In a case where the RF sputter etching is carried out, the wet cleaning may be lightly carried out. On the other hand, in a case where the RF sputter etching is omitted, the wet cleaning is carried out so that impurities such as a natural oxide film are completely removed.

In a case where the RF sputter etching is omitted, the wet cleaning may be carried out in two processes. The first process for the wet cleaning is divided into three steps: using a hydrogen fluoride (HF) solution diluted with deionized (DI) water (first step); using a mixture solution (also known as SC1 solution) of ammonium hydroxide, hydrogen peroxide ($H_2O_2$), and water (second step); and using a HF solution diluted with DI water. A 100:1 diluted HF solution or a 200:1 diluted HF solution may be used as the diluted HF solution. The first step is carried out for about 10 to 300 seconds, preferably about 150 seconds, the second step is carried out at a temperature of 40 to 90° C., preferably 70° C., for about 1 to 60 minutes, preferably about 30 minutes, and the third step is carried out for about 10 to 300 seconds, preferably about 60 seconds. The second process for the wet cleaning is divided into two steps: using a mixture solution of sulfuric acid and $H_2O_2$ (first step) and using a HF solution diluted with DI water (second step). Preferably, the ratio of sulfuric acid to $H_2O_2$ is 6 to 1. A 100:1 diluted HF solution or a 200:1 diluted HF solution may be used as the diluted HF solution. The first step is carried out at 120° C. for about 500 to 700 seconds, preferably 600 seconds, and the second step is carried out for 150 to 300 seconds, preferably 250 seconds.

On the other hand, in a case where the RF sputter etching is carried out, the steps in the above-described two wet cleaning processes may be carried out for a shorter time. Alternatively, the wet cleaning may be carried out only using a diluted HF solution.

Next, the Co-containing film 111 is conformally formed along an exposed stepped surface of the substrate 100 (step S3).

The Co-containing film 111 may be a pure Co film made of 100% Co or a Co alloy film. Preferably, the Co alloy film contains 20 or less atomic % of one selected from tantalum (Ta), zirconium (Zr), titanium (Ti), nickel (Ni), hafnium (Hf), tungsten (W), platinum (Pt), palladium (Pd), vanadium (V), niobium (Nb), and mixtures thereof.

The Co-containing film 111 is formed by sputtering. The thickness of the Co-containing film 111 is determined according to the critical dimension (CD) or height of the gate 105. For example, if the CD of the gate is 100 nm, it is preferable to form the Co-containing film to a thickness of less than 150 Å.

The Co-containing film 111 may be deposited at a temperature higher than a room temperature. However, it is preferable to deposit the Co-containing film 111 at a high temperature of 300 to 500° C. When the Co-containing film 111 is deposited at a high temperature, as shown in an enlarged circle of FIG. 6B, Co of the Co-containing film 11 reacts with Si of the source/drain regions 109n and 109p and poly-Si of the gate 105, to thereby form an interface film 115a made of dicobalt monosilicide ($Co_2Si$) or monocobalt monosilicide (CoSi). The interface film 115a serves to restrain diffusion of Co during a subsequent annealing process. The detailed description thereof will be described later.

Next, the Ti-rich capping film 113 is formed on the Co-containing film 111 (step S4). As used herein, the term, "Ti-rich capping film" indicates a film with a Ti/other elements atomic % ratio of more than 1. The Ti-rich capping film may be one selected from the group consisting of a titanium nitride film with a Ti/nitrogen (N) atomic % ratio of more than 1, a titanium tungsten film with a Ti/W atomic % ratio of more than 1, a laminated structure of a pure Ti film and a titanium nitride film with a Ti/N atomic % ratio of more than 1, a laminated structure of a pure Ti film and a titanium nitride film with a Ti/N atomic % ratio of less than 1, a laminated structure of a pure Ti film and a titanium tungsten film with a Ti/W atomic % ratio of more than 1, and a laminated structure of a pure Ti film and a titanium tungsten film with a Ti/W atomic % ratio of less than 1. The Ti-rich capping film 113 may also be a pure Ti film made of 100% Ti.

The capping film 113 is also formed by sputtering. For example, in the case of a titanium nitride film with a Ti/N atomic % ratio of more than 1, the capping film 113 with a desired composition ratio can be formed by depositing a Ti target while adjusting the flow rate of a nitrogen gas supplied into a sputtering apparatus. The function of the capping film 113 will be described later.

Preferably, the RF sputter etching (step S3'), the formation of the Co-containing film (step S3), and the formation of the Ti-rich capping film (step S4) are carried out in situ.

Figure 6C:
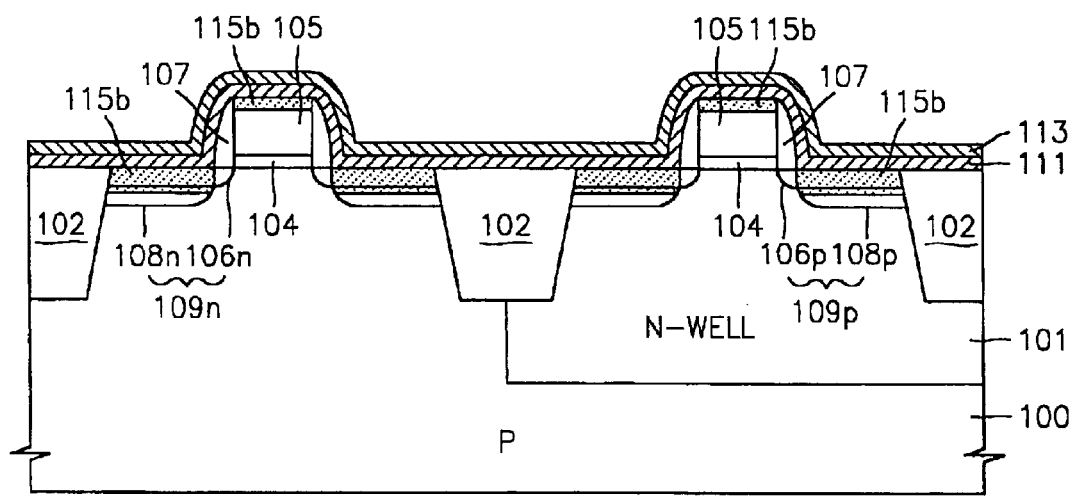

Referring to FIGS. 5 and 6C, the resultant structure having the Co-containing film 111 and the Ti-rich capping film 113 are annealed at a low temperature (step S5). The low temperature annealing may be a rapid thermal annealing (RTA) at a temperature range of 350 to 650° C.

When the low temperature annealing begins, Ti in the capping film 113 first efficiently removes residual impurities on upper surfaces of the source/drain regions 109n and 109p, and the gate 105, which are in contact with the Co-containing film 111.

The Ti removes impurities such as oxide, nitride, and silicon, which are generated by the RF sputter etching for pretreatment carried out before the formation of the Co-containing film 111.

Ti also removes impurities generated on an exposed surface of the substrate 100 during a delay time between the wet cleaning and the formation of the Co-containing film 111 when the RF sputter etching is omitted. Such a delay time is caused because the wet cleaning and the formation of the Co-containing film are not carried out in situ.

Therefore, the Ti-rich capping film 113 serves to prevent formation of a low quality cobalt silicide film otherwise caused by impurities generated by the RF sputter etching. In addition, in the case where the wet cleaning pretreatment is used alone to prevent the generation of impurities, even though a surface of the substrate 100 is exposed in the air for a long time after the wet cleaning, the Ti can remove impurities generated on the surface of the substrate 100 as a result of the exposure. Therefore, a process window for a delay time between the wet cleaning and the formation of the Co-containing film 111 can be increased.

When Ti efficiently removes impurities, Co of the Co-containing film 111 diffuses toward the source/drain regions 109n and 109p and the gate 105 and then reacts with (poly)Si to thereby form a high quality CoSi film 115b.

Meanwhile, the diffusion restraint interface film 115a made of $Co_2Si$ or CoSi formed upon the formation of the Co-containing film 111 at 300 to 500° C. serves to decrease the diffusion speed of the Co, thereby retarding the formation of a cobalt silicide film. That is, referring to FIG. 7, $Co_2Si$ or CoSi that constitutes the diffusion restraint interface film 115a is in a polycrystalline phase. For this reason, Co of the Co-containing film 111 placed on the interface film 115a can diffuse toward the substrate 100 only through diffusion paths 200, i.e., polycrystalline grain boundaries. The number of diffusion paths 200 in the presence of the interface film 115a is less than the number of diffusion paths 250 in the absence of the interface film 115a. For this reason, in the presence of the interface film 115a, less of the Co reacts with Si. Therefore, Rs loading and an increase in leakage current caused by the edge effect can be inhibited.

As a result of the low temperature annealing, $Co_2Si$ of the interface film 115a is transformed into CoSi.

Figure 6D:
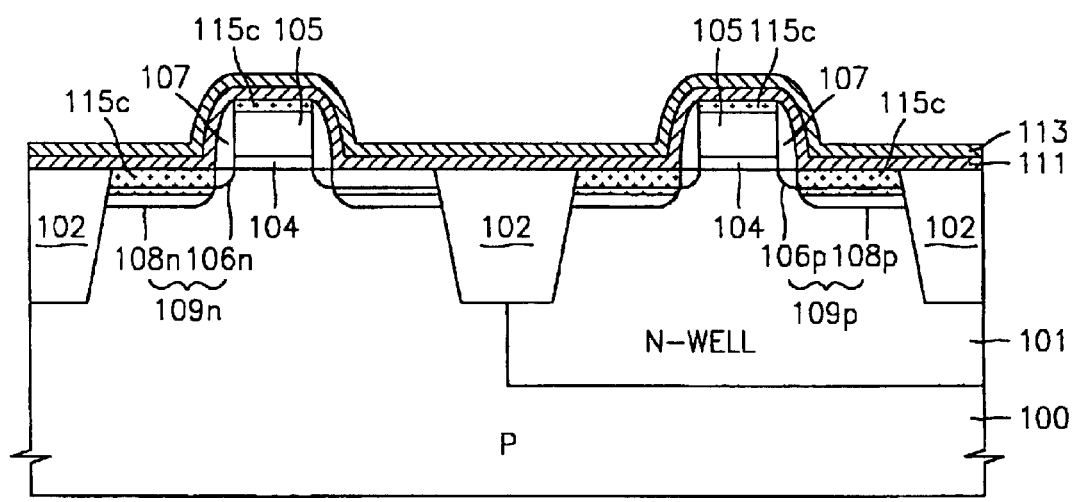

Referring to FIGS. 5 and 6D, a wet etching is carried out to selectively remove the capping film 113 and the Co-containing film 111 remaining unreacted by the low temperature annealing (step S6). The wet etching is carried out using a mixture solution of sulfuric acid and ammonium hydroxide or a mixture solution of phosphoric acid, acetic acid, nitric acid, and $H_2O_2$.

Next, an annealing at a high temperature is carried out (step S7). As a result of the high temperature annealing, the CoSi film 115b is transformed into a $CoSi_{2\ film\ 115}c$ having a low resistance. The $CoSi_{2\ film\ 115}c$ is more stable and has a lower resistance, when compared to the CoSi film 115b. The high temperature annealing may be a rapid thermal anneal (RTA) at a temperature range of 700 to 900° C.

Figure 7:
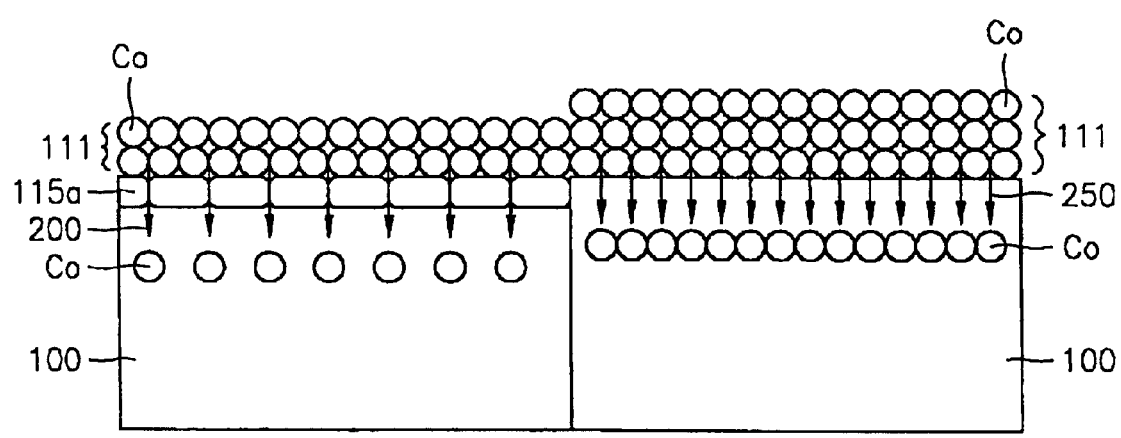
FIG. 7 is a sectional view for explaining a diffusion restraint characteristic of an interface film formed in the deposition of a cobalt film at a high temperature.

Embodiments described with reference to FIGS. 5 through 7 are directed to a self-align silicide process. When needed, a silicide blocking film may be formed to protect regions which do not require cobalt silicidation.

In a dynamic random access memory (DRAM), a silicide film is formed only on a gate to decrease a gate resistance and to maintain an optimal refresh time. Therefore, a silicide film is not formed on an active region. In the case of a merged DRAM with logic (MDL) device which have recently gained notoriety in terms of high performance and small chip size, in a peripheral circuit and a logic, a silicide film is formed both on an active region and a gate or on a part of the active region and a part of the gate to reduce a contact resistance or a sheet resistance of the gate and source/drain. On the other hand, in a memory cell array, a silicide film is formed only on a gate to maintain an optimal refresh time. In the case of a nonvolatile memory device, a silicide film is formed only on a gate to prevent a resistance increase resulting from a decrease in gate length accompanying an increase in pattern density. In addition, when needed, instead of forming a silicide film on a gate, a silicide film may be formed only on a source/drain region.

Therefore, the silicide blocking film is used to expose only regions intended for formation of a silicide film. The formation of the silicide blocking film may be carried out prior to the wet cleaning.

Hitherto, the formation of a cobalt silicide film on a source/drain and a gate has been described. However, it is understood that a cobalt silicide film can be formed at any conductive regions made of (poly) Si that require a low resistance.

Hereinafter, the present invention will be described in more detail with reference to non-limiting experimental examples.

EXPERIMENTAL EXAMPLE 1

A six-transistor (6Tr)-SRAM cell was manufactured on a semiconductor wafer substrate according to 110 nm design rules using the following method of forming a cobalt silicide film according to the present invention to prepare a test sample.

The front surface of the substrate having a poly-Si gate pattern with a sidewall spacer and a source/drain region (hereinafter, referred to as "underlying structure(s)") was wet-cleaned using a SC1 solution and then a HF solution. The substrate was etched by RF sputtering using an argon (Ar) gas to remove an oxide film to a thickness of 50 Å, a Co film was formed to a thickness of 100 Å by sputtering, and a Ti-rich, titanium nitride capping film was formed to a thickness of 100 Å at a flow rate of an $N_2$ gas. The RF sputter etching, the formation of the Co film, and the formation of the titanium nitride capping film were carried out in situ. According to a rutherfold backscattering spectroscopy (RBS) analysis, a Ti/N atomic % ratio in the capping film was 3.33.

A primary RTA was carried out at 450° C. for 90 seconds, the capping film and unreacted Co film were removed by a mixture solution of sulfuric acid and $H_2O_2$, and then a secondary RTA was carried out at 800° C. for 30 seconds.

The scanning electron microphotographs (SEMs) of $CoSi_2$ films thus obtained are shown in FIGS. 8A and 8B. FIG. 8A is a top plan view of a gate and FIG. 8B is a top plan view of an active region exposed by a contact pattern.

Meanwhile, a control sample was prepared under the above-described process conditions except that the capping film was formed at an $N_2$ flow rate of 85 sccm. According to a RBS analysis, a Ti/N atomic % ratio in the capping film of the control sample was 0.89.

The SEMs of $CoSi_2$ films of the control sample are shown in FIGS. 9A and 9B. FIG. 9A is a top plan view of a gate and FIG. 9B is a top plan view of an active region.

In comparison between the SEMs of the test sample (FIGS. 8A and 8B) and the SEMs of the control sample (FIGS. 9A and 9B), the $CoSi_2$ films formed by using the Ti-rich capping film according to the present invention exhibited better morphologies than those formed by using the N-rich capping films.

EXPERIMENTAL EXAMPLE 2

The sheet resistances (Rs) of NMOS gates and PMOS gates in the test sample and the control sample prepared in Experimental Example 1 was measured and the results are shown in FIGS. 10A and 10B. FIG. 10A shows the Rs of NMOS gates and FIG. 10B shows the Rs of PMOS gates. In FIGS. 10A and 10B, —○— represents the test sample and —□— represents the control sample.

As shown in FIGS. 10A and 10B, while the test sample exhibited a very low, uniform Rs distribution, the control sample exhibited a very high, nonuniform Rs distribution. This result demonstrates that the Ti-rich capping film efficiently removes impurities such as oxide and nitrogen present in an interface between the Co film and a source/drain region or a gate.

EXPERIMENTAL EXAMPLE 3

A test sample and a control sample were prepared in the same manner as Experimental Example 1. Secondary ion-mass spectrometric (SIMS) results after primary RTA and after a selective wet etching are respectively shown in FIGS. 11A and 11B.

In FIGS. 11A and 11B, —♦— and —▼— represent the test sample and —○— and —□— represent the control sample. As shown in FIG. 11B, the surface of the test sample (using Ti-rich capping film) had a higher Ti content than that of the control sample (using N-rich capping film), by as much as $10^2$. In FIG. 11B, a region having the depth of 0 $\mu$m corresponds to the surface of a Si region before a primary RTA and, at the same time, to an interface of a Co film and a cobalt silicide film before a selective wet etching. Judging from the fact that a Si region is transformed into a cobalt silicide film while Co diffuses toward the Si region and the result of FIG. 11B, it can be seen that a large amount of Ti diffuses toward an interface between a Co film and a source/drain region or a gate region and then efficiently removes impurities at the interface.

EXPERIMENTAL EXAMPLE 4

A test sample was prepared in the same manner as in the preparation of the test sample in Experimental Example 1 except that a wet cleaning was carried out alone in the pretreatment process, i.e., the pretreatment did not include RF sputter etching. The wet cleaning was carried out by using a 200:1 diluted HF solution for 150 seconds, using a SC1 solution for 30 minutes, and then using a 200:1 diluted HF solution for 90 seconds. After a cobalt silicide film was formed, a p+/n junction leakage current was measured in a PMOS.

As a control sample, the front surface of a substrate having underlying structures was wet-cleaned by using a SC1 solution and then a HF solution and etched by RF sputtering in an Ar gas. Then, a Co film was formed to a thickness of 100 Å by sputtering, and an N-rich, titanium nitride capping film was formed to a thickness of 100 Å at an $N_2$ flow rate of 85 sccm. Subsequent processes were carried out in the same manner as those of the above test sample. A p+/n junction leakage current was measured in a PMOS.

The measured leakage current is shown in FIG. 12. In FIG. 12, —□— represents the test sample and —○— represents the control sample. The test sample exhibited an enhanced leakage current and a uniform leakage current distribution.

EXPERIMENTAL EXAMPLE 5

A Co film was deposited to a thickness of 80 Å on a Si substrate at a high temperature of 400° C. and a transmission electron microphotograph (TEM) of the obtained structure is shown in FIG. 13A. As shown in FIG. 13A, an interface film with a thickness of 20 to 28 Å was observed between the Co film and the Si substrate.

In order to determine the type of the formed interface film, the selected area diffraction (SAD) patterns of the interface film were measured and the results are shown in FIGS. 13B and 13C. It was demonstrated that the interface film formed by the high temperature deposition was made of $Co_2Si$ and $CoSi$.

EXPERIMENTAL EXAMPLE 6

A Si substrate having underlying structures was treated with a SC1 solution and then a HF solution and then etched by RF sputtering in an Ar gas. Then, a Co film was deposited to a thickness of 100 Å at 400° C., and a Ti-rich capping film was deposited to a thickness of 10 Å. Then, a primary RTA was carried out at 450° C. for 90 seconds, the capping film and unreacted Co film were removed using a mixture solution of sulfuric acid and $H_2O_2$, and then a secondary RTA was carried out at 800° C. for 30 seconds. As a result, a test sample 1 was prepared.

A test sample 2 was prepared in the same manner as in the preparation of the test sample 1 except that the primary RTA was carried out for 30 seconds.

A control sample 1 was prepared in the same manner as in the preparation of the test sample 1 except that the Co film was deposited at 150° C.

A control sample 2 was prepared in the same manner as in the preparation of the test sample 2 except that the Co film was deposited at 150° C.

The Rs values for conductive regions of the test samples 1 and 2 and the control samples 1 and 2 are presented in Table 1 below.

TABLE 1

| | Sheet resistance (Rs) ($\Omega$/sq.) | | | | | |
|---|---|---|---|---|---|---|
| Sample | N-active region (CD = 0.26 $\mu$m) | N-gate (CD = 0.13 $\mu$m) | N-gate (CD = 0.65 $\mu$m) | P-active region (CD = 0.26 $\mu$m) | P-gate (CD = 0.13 $\mu$m) | P-gate (CD = 0.65 $\mu$m) |
| Control sample 1 | 7.8 | 6.2 | 8.0 | 7.8 | 6.2 | 8.0 |
| Control sample 2 | 8.2 | 7.0 | 8.4 | 7.8 | 7.0 | 8.4 |
| Test sample 1 | 8.2 | 7.8 | 8.2 | 8.0 | 7.8 | 8.2 |
| Test sample 2 | 12.2 | 9.0 | 8.7 | 12.0 | 9.2 | 8.6 |

CD: critical dimension

In the control sample 1, the Rs value of the 0.13 $\mu$m gate was smaller than that of the 0.65 $\mu$m gate. From this result, it can be seen that as the CD of a gate decreases, the thickness of a cobalt suicide film increases. Therefore, it can be anticipated that this phenomenon will be intensified as the CD of a gate reduces to less than 100 nm.

In a comparison between the control samples 1 and 2, a variation in the Rs values according to the CD reduced when the duration of the primary RTA was reduced from 90 seconds to 30 seconds. However, the reduction rate was insignificant.

In a comparison between the control sample 1 and the test sample 1, it can be seen that when a Co film is deposited at a high temperature (400° C.) according to the present invention, a variation in the Rs values according to the CD significantly decreases, thereby minimizing the loading of the Rs of a silicide film. This result demonstrates that a cobalt silicide interface film generated by a high temperature deposition serves as a diffusion restraint film.

In a comparison between the test samples 1 and 2, when the duration of the primary RTA was reduced from 90 seconds to 30 seconds, the Rs value of the 0.13 μm gate was larger than that of the 0.65 μm gate. This result suggests that even though the CD of a gate is reduced to less than 100 nm, the loading of the Rs of a silicide film can be solved by adjusting a deposition temperature and a duration of a RTA. That is, this indicates that a method of forming a cobalt silicide film at a high temperature according to the present invention provides a very large process window.

EXPERIMENTAL EXAMPLE 7

Leakage current characteristics of the test sample 1 and the control sample 1 prepared in Experimental Example 6 was measured and the results are shown in FIG. 14. In FIG. 14, —□— represents the test sample 1 and —○— represents the control sample 1. The test sample 1 exhibited substantially enhanced leakage current characteristics, relative to the control sample 1. While a cobalt silicide film was formed to a thickness of 300 to 360 Å in an active region and a STI edge region of the test sample 1, a cobalt silicide film was deeply formed to a thickness of 370 to 700 Å in an active region and a STI edge region of the control sample 1.

These facts demonstrate that a cobalt silicide interface film formed upon a high temperature Co deposition efficiently restrains diffusion of Co into a Si-containing conductive region.

As apparent from the above description, the present invention provides a method of forming a cobalt silicide film. According to this method, a capping film is formed in the form of a Ti-rich film and a RF sputter etching that generates impurities can be omitted. Therefore, formation of a low quality cobalt silicide film otherwise caused by impurities at an interface between a Co film and a Si-containing conductive region is prevented. Furthermore, a reaction velocity for formation of a cobalt silicide film can be adjusted by use of an interface film formed upon the formation of a Co film at a high temperature. Therefore, a small process window for formation of a cobalt silicide film resulting from the edge effect can be efficiently solved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a cobalt suicide film, said method comprising:
forming a cobalt-containing film on a surface of a semiconductor substrate having an insulating region and a silicon-containing conductive region, the cobalt-containing film being formed at a temperature at which cobalt of the cobalt-containing film and silicon of the silicon-containing conductive region react with each other to form a diffusion restraint interface film interposed between the cobalt-containing film and silicon of the silicon-containing conductive region;
forming a titanium-rich capping film on the cobalt-containing film to obtain a resultant structure, the titanium-rich capping film having a titanium/other elements atomic % ratio of more than 1; and
annealing the resultant structure so that cobalt of the cobalt-containing film and silicon of the silicon-containing conductive region react with each other to form the cobalt suicide film.

2. The method according to claim 1, wherein the capping film is one selected from the group consisting of a pure titanium film, a titanium nitride film having a titanium/nitrogen atomic % ratio of more than 1, a titanium tungsten film having a titanium/tungsten atomic % ratio of more than 1, a laminated structure of a pure titanium film and a titanium nitride film having a titanium/nitrogen atomic % ratio of more than 1, a laminated structure of a pure titanium film and a titanium nitride film having a titanium/nitrogen atomic % ratio of less than 1, a laminated structure of a pure titanium film and a titanium tungsten film having a titanium/tungsten atomic % ratio of more than 1, and a laminated structure of a pure titanium film and a titanium tungsten film having a titanium/tungsten atomic % ratio of less than 1.

3. The method according to claim 1, wherein the capping film is a titanium nitride film having a titanium/nitrogen atomic % ratio of more than 1.

4. The method according to claim 1, further comprising, before the formation of the cobalt-containing film, a pretreatment process of removing at least one of a natural oxide film and impurities formed on the silicon-containing conductive region.

5. The method according to claim 4, wherein the pretreatment process comprises:
wet-cleaning the surface of the semiconductor substrate; and
etching the wet-cleaned surface of the semiconductor substrate by radio frequency (RF) sputtering.

6. The method according to claim 4, wherein the pretreatment process is devoid of radio frequency (RF) sputter etching.

7. The method according to claim 6, wherein the pretreatment process comprises:
wet-cleaning the surface of the semiconductor substrate using a hydrogen fluoride (HF) solution diluted with deionized (DI) water;
wet-cleaning the surface of a semiconductor substrate using a mixture solution of ammonium hydroxide, hydrogen peroxide ($H_2O_2$), and water; and
wet-cleaning the surface of a semiconductor substrate using a HF solution diluted with DI water.

8. The method according to claim 6, wherein the pretreatment process comprises:
wet-cleaning the surface of the semiconductor substrate using a mixture solution of sulfuric acid and $H_2O_2$; and
wet-cleaning the surface of the semiconductor substrate using a HF solution diluted with DI water.

9. The method according to claim 1, wherein the cobalt-containing film is a pure cobalt film, or a cobalt alloy film containing 20 or less atomic % of one selected from the group consisting of tantalum, zirconium, titanium, nickel, hafnium, tungsten, platinum, palladium, vanadium, niobium, and mixtures thereof.

10. The method of claim 1, wherein the cobalt-containing film is formed at a temperature range of 300–500° C.

11. The method according to claim 1, wherein the annealing comprises:
primary rapid thermal annealing at a first temperature so that cobalt of the cobalt-containing film reacts with silicon of the silicon-containing conductive region to form a monocobalt monosilicide film;
selectively removing the capping film and the cobalt-containing film remaining unreacted during the primary rapid thermal annealing; and
secondary rapid thermal annealing at a second temperature which is higher than the first temperature so that the monocobalt monosilicide film is transformed into a monocobalt disilicide film.

12. The method according to claim 11, wherein the first temperature is in the range of 350 to 650° C. and the second temperature is in the range of 700 to 900° C.

13. A method of forming a cobalt suicide film, said method comprising:
- forming a cobalt-containing film on a surface of a semiconductor substrate having an insulating region and a silicon-containing conductive region, the cobalt-containing film being formed at a temperature between 300 and 500° C. at which cobalt of the cobalt-containing film and silicon of the silicon-containing conductive region react with each other to form a diffusion restraint interface film made of dicobalt monosilicide or monocobalt monosilicide interposed between the cobalt-containing film and silicon of the silicon-containing conductive region;
- forming a titanium-rich capping film on the cobalt-containing film to obtain a resultant structure, the titanium-rich capping film having a titanium/other elements atomic % ratio of more than 1; and
- annealing the resultant structure so that the diffusion restraint interface film is transformed into a monocobalt disilicide film, and cobalt of the cobalt-containing film reacts with silicon of the silicon-containing conductive region to form a monocobalt disilicide film.

14. The method according to claim 13, wherein the capping film is one selected from the group consisting of a pure titanium film, a titanium nitride film having a titanium/nitrogen atomic % ratio of more than 1, a titanium tungsten film having a titanium/tungsten atomic % ratio of more than 1, a laminated structure of a pure titanium film and a titanium nitride film having a titanium/nitrogen atomic % ratio of more than 1, a laminated structure of a pure titanium film and a titanium nitride film having a titanium/nitrogen atomic % ratio of less than 1, a laminated structure of a pure titanium film and a titanium tungsten film having a titanium/tungsten atomic % ratio of more than 1, and a laminated structure of a pure titanium film and a titanium tungsten film having a titanium/tungsten atomic % ratio of less than 1.

15. The method according to claim 13, wherein the capping film is a titanium nitride film having a titanium/nitrogen atomic % ratio of more than 1.

16. The method according to claim 13, further comprising, before the formation of the cobalt-containing film, a pretreatment process of removing at least one of a natural oxide film and impurities formed on the silicon-containing conductive region.

17. The method according to claim 16, wherein the pretreatment process comprises:
- wet-cleaning the surface of the semiconductor substrate; and
- etching the wet-cleaned surface of the semiconductor substrate by radio frequency (RF) sputtering.

18. The method according to claim 16, wherein the pretreatment process is devoid of radio frequency (RF) sputter etching.

19. The method according to claim 18, wherein the pretreatment process comprises:
- wet-cleaning the surface of the semiconductor substrate using a HF solution diluted with DI water;
- wet-cleaning the surface of the semiconductor substrate using a mixture solution of ammonium hydroxide, $H_2O_2$, and water; and
- wet-cleaning the surface of the semiconductor substrate using a HF solution diluted with DI water.

20. The method according to claim 18, wherein the pretreatment process comprises:
- wet-cleaning the surface of the semiconductor substrate using a mixture solution of sulfuric acid and $H_2O_2$; and
- wet-cleaning the surface of the semiconductor substrate using a HF solution diluted with DI water.

21. The method according to claim 13, wherein the cobalt-containing film is a pure cobalt film, or a cobalt alloy film containing 20 or less atomic % of one selected from tantalum, zirconium, titanium, nickel, hafnium, tungsten, platinum, palladium, vanadium, niobium, and mixtures thereof.

22. The method according to claim 13, wherein the annealing comprises:
- primary rapid thermal annealing at a first temperature so that the dicobalt monosilicide of the diffusion restraint interface film is transformed into monocobalt disilicide, and cobalt of the cobalt-containing film reacts with silicon of the silicon-containing conductive region to form a monocobalt monosilicide film;
- selectively removing the capping film and the cobalt-containing film remaining unreacted during the primary rapid thermal annealing; and
- secondary rapid thermal annealing at a second temperature which is higher than the first temperature so that the monocobalt monosilicide film is transformed into a monocobalt disilicide film.

23. The method according to claim 22, wherein the first temperature is in the range of 350 to 650° C. and the second temperature is in the range of 700 to 900° C.

24. A method of forming a cobalt silicide film, said method comprising:
- wet-cleaning a surface of the semiconductor substrate having an insulating region and a silicon-containing conductive region;
- forming a cobalt-containing film on the wet-cleaned silicon-containing conductive region, the cobalt-containing film being formed at a temperature between 300 and 500° C. at which cobalt of the cobalt-containing film and silicon of the silicon-containing conductive region react with each other to form a diffusion restraint interface film made of dicobalt monosilicide or monocobalt monosilicide interposed between the cobalt-containing film and silicon of the silicon-containing conductive region;
- forming, on the cobalt-containing film, a titanium-rich capping film with a titanium/other elements atomic % ratio of more than 1;
- primary rapid thermal annealing at a first temperature so that dicobalt monosilicide of the diffusion restraint interface film is transformed into monocobalt monosilicide, and cobalt of the cobalt-containing film reacts with silicon of the silicon-containing conductive region to form a monocobalt monosilicide film;
- selectively removing the capping film and the cobalt-containing film remaining unreacted in the primary rapid thermal annealing; and
- secondary rapid thermal annealing at a second temperature which is higher than the first temperature so that the monocobalt monosilicide film is transformed into a monocobalt disilicide film.

25. A method of manufacturing a semiconductor device, the method comprising:
- forming an isolation region defining an active region on a semiconductor substrate;
- forming, on the active region, a source/drain region and a gate, the gate having a sidewall spacer and being made of polysilicon doped with impurities;

pretreating the source/drain region and the gate to remove at least one of the a natural oxide film and impurities;

forming a cobalt-containing film on a surface of the substrate at a temperature between 300–500° C. at which cobalt of the cobalt-containing film and silicon of the substrate react with each other to form a diffusion restraint interface film interposed between the cobalt-containing film and the substrate;

forming a titanium-rich capping film on the cobalt-containing film to obtain a resultant structure, the titanium-rich capping film having a titanium/other elements atomic % ratio of more than 1; and annealing the resultant structure so that cobalt of the cobalt-containing film and silicon of the gate and the source/drain region react with each other to form a cobalt suicide film.

26. The method according to claim 25, wherein the capping film is one selected from the group consisting of a pure titanium film, a titanium nitride film having a titanium/nitrogen atomic % ratio of more than 1, a titanium tungsten film having a titanium/tungsten atomic % ratio of more than 1, a laminated structure of a pure titanium film and a titanium nitride film having a titanium/nitrogen atomic % ratio of more than 1, a laminated structure of a pure titanium film and a titanium nitride film having a titanium/nitrogen atomic % ratio of less than 1, a laminated structure of a pure titanium film and a titanium tungsten film having a titanium/tungsten atomic % ratio of more than 1, and a laminated structure of a pure titanium film and a titanium tungsten film having a titanium/tungsten atomic % ratio of less than 1.

27. The method according to claim 25, wherein the capping film is a titanium nitride film having a titanium/nitrogen atomic % ratio of more than 1.

28. The method according to claim 25, wherein the pretreatment process comprises:
wet-cleaning the surface of the semiconductor substrate; and
etching the wet-cleaned surface of semiconductor substrate by radio frequency (RF) sputtering.

29. The method according to claim 25, wherein the pretreatment process is devoid of radio frequency (RF) sputter etching.

30. The method according to claim 29, wherein the pretreatment process comprises:
wet-cleaning the surface of the semiconductor substrate using a HF solution diluted with DI water;
wet-cleaning the surface of the semiconductor substrate using a mixture solution of ammonium hydroxide, $H_2O_2$, and water; and
wet-cleaning the surface of the semiconductor substrate using a HF solution diluted with DI water.

31. The method according to claim 29, wherein the pretreatment process comprises:
wet-cleaning the surface of the semiconductor substrate using a mixture solution of sulfuric acid and $H_2O_2$; and
wet-cleaning the surface of the semiconductor substrate using a HF solution diluted with DI water.

32. The method according to claim 25, wherein the cobalt-containing film is a pure cobalt film, or a cobalt alloy film containing 20 or less atomic % of one selected from tantalum, zirconium, titanium, nickel, hafnium, tungsten, platinum, palladium, vanadium, niobium, and mixtures thereof.

33. The method according to claim 25, wherein the annealing comprises:
primary rapid thermal annealing at a first temperature so that cobalt of the cobalt-containing film reacts with silicon of the silicon-containing conductive region to form a monocobalt monosilicide film;

selectively removing the capping film and the cobalt-containing film remaining unreacted during the primary rapid thermal annealing; and secondary rapid thermal annealing at a second temperature which is higher than the first temperature so that the monocobalt monosilicide film is transformed into a monocobalt disilicide film.

34. The method according to claim 33, wherein the first temperature is in the range of 350 to 650° C. and the second temperature is in the range of 700 to 900° C.

35. A method of manufacturing a semiconductor device, said method comprising:
forming an isolation region defining an active region on a semiconductor substrate;
forming, on the active region, a source/drain region and a gate, the gate having a sidewall spacer and being made of polysilicon doped with impurities;
forming a cobalt-containing film on a surface of the semiconductor substrate, the cobalt-containing film being formed at a temperature at which cobalt of the cobalt-containing film and silicon of the source/drain region and the gate react with each other to form a diffusion restraint interface film made of dicobalt monosilicide or monocobalt monosilicide interposed between the cobalt-containing film and silicon of the source/drain region and the gate;
forming a titanium-rich capping film on the cobalt-containing film to obtain a resultant structure, the titanium-rich capping film having a titanium/other elements atomic % ratio of more than 1; and
annealing the resultant structure so that the diffusion restraint interface film is transformed into a monocobalt disilicide film, and cobalt of the cobalt-containing film reacts with silicon of the source/drain region and the gate to form a monocobalt disilicide film.

36. The method according to claim 35, wherein the capping film is one selected from the group consisting of a pure titanium film, a titanium nitride film having a titanium/nitrogen atomic % ratio of more than 1, a titanium tungsten film having a titanium/tungsten atomic % ratio of more than 1, a laminated structure of a pure titanium film and a titanium nitride film having a titanium/nitrogen atomic % ratio of more than 1, a laminated structure of a pure titanium film and a titanium nitride film having a titanium/nitrogen atomic % ratio of less than 1, a laminated structure of a pure titanium film and a titanium tungsten film having a titanium/tungsten atomic % ratio of more than 1, and a laminated structure of a pure titanium film and a titanium tungsten film having a titanium/tungsten atomic % ratio of less than 1.

37. The method according to claim 35, wherein the capping film is a titanium nitride film having a titanium/nitrogen atomic % ratio of more than 1.

38. The method according to claim 35, further comprising, before the formation of the cobalt-containing film, a pretreatment process of removing at least one of a natural oxide film and impurities formed on the source/drain region and the gate.

39. The method according to claim 38, wherein the pretreatment process comprises:
wet-cleaning the surface of the semiconductor substrate; and
etching the wet-cleaned surface of the semiconductor substrate by radio frequency (RF) sputtering.

40. The method according to claim 38, wherein the pretreatment process is devoid of radio frequency (RF) sputter etching.

41. The method according to claim 40, wherein the pretreatment process comprises:
wet-cleaning the surface of the semiconductor substrate using a HF solution diluted with DI water;

wet-cleaning the surface of the semiconductor substrate using a mixture solution of ammonium hydroxide, $H_2O_2$, and water; and wet-cleaning the surface of the semiconductor substrate using a HF solution diluted with DI water.

42. The method according to claim 40, wherein the pretreatment process comprises:

wet-cleaning the surface of the semiconductor substrate using a mixture solution of sulfuric acid and $H_2O_2$; and wet-cleaning the surface of the semiconductor substrate using a HF solution diluted with DI water.

43. The method according to claim 35, wherein the cobalt-containing film is a pure cobalt film, or a cobalt alloy film containing 20 or less atomic % of one selected from tantalum, zirconium, titanium, nickel, hafnium, tungsten, platinum, palladium, vanadium, niobium, and mixtures thereof.

44. The method according to claim 35, wherein the annealing comprises:

primary rapid thermal annealing at a first temperature so that the dicobalt monosilicide of the diffusion restraint interface film is transformed into monocobalt monosilicide, and cobalt of the cobalt-containing film reacts with silicon of the source/drain region and the gate to form a monocobalt monosilicide film;

selectively removing the capping film and the cobalt-containing film remaining unreacted during the primary rapid thermal annealing; and secondary rapid thermal annealing at a second temperature which is higher than the first temperature so that the monocobalt monosilicide film is transformed into a monocobalt disilicide film.

45. The method according to claim 44, wherein the first temperature is in the range of 350 to 650° C. and the second temperature is in the range of 700 to 900° C.

46. A method of manufacturing a semiconductor device, the method comprising:

forming an isolation region defining an active region on a semiconductor substrate;

forming, on the active region, a source/drain region and a gate, the gate having a sidewall spacer and being made of polysilicon doped with impurities;

wet-cleaning a surface of the semiconductor substrate;

forming a cobalt-containing film on the surface of the semiconductor substrate, the cobalt-containing film being formed at a temperature at which cobalt of the cobalt-containing film and silicon of the source/drain region and the gate react with each other to form a diffusion restraint interface film made of dicobalt monosilicide or monocobalt monosilicide interposed between the cobalt-containing film and silicon of the source/drain region and the gate;

forming, on the cobalt-containing film, a titanium-rich capping film having a titanium/other elements atomic % ratio of more than 1;

primary rapid thermal annealing at a first temperature so that the diffusion restraint interface film is transformed into a monocobalt monosilicide film, and cobalt of the cobalt-containing film reacts with silicon of the source/drain region and the gate to form a monocobalt monosilicide film;

selectively removing the capping film and the cobalt-containing film remaining unreacted during the primary rapid thermal annealing; and secondary rapid thermal annealing at a second temperature which is higher than the first temperature so that the monocobalt monosilicide film is transformed into a monocobalt disilicide film.

47. The method according to claim 1, wherein the diffusion restraint interface film is made of dicobalt monosilicide or monocobalt monosilicide.

48. The method of claim 35, wherein the cobalt-containing film is formed at a temperature range of 300–500° C.

49. The method of claim 46, wherein the cobalt-containing film is formed at a temperature range of 300–500° C.

* * * * *